Dec. 1, 1964 H. DA COSTA ETAL 3,159,188

METHOD OF SUPPLYING WIRE FOR MOUNTING IN ELECTRONIC UNITS

Original Filed Aug. 11, 1959 3 Sheets-Sheet 1

INVENTORS.
Harry da Costa,
Donald W. Williams,
By Mueller & Aichele
Att'ys

METHOD OF SUPPLYING WIRE FOR MOUNTING IN ELECTRONIC UNITS

Original Filed Aug. 11, 1959

INVENTORS.
Harry da Costa
Donald W. Williams
By Mueller & Aichele Attys.

METHOD OF SUPPLYING WIRE FOR MOUNTING IN ELECTRONIC UNITS

Original Filed Aug. 11, 1959 3 Sheets-Sheet 3

INVENTORS.
Harry da Costa,
Donald W. Williams,
By Mueller & Aichele Atty's.

3,159,188
Patented Dec. 1, 1964

1

3,159,188
METHOD OF SUPPLYING WIRE FOR MOUNTING IN ELECTRONIC UNITS

Harry da Costa, Scottsdale, and Donald W. Williams, Mesa, Ariz., assignors to Motorola, Inc., Chicago, Ill., a corporation of Illinois Continuation of application Ser. No. 833,056, Aug. 11, 1959. This application Mar. 1, 1962, Ser. No. 178,219
2 Claims. (Cl. 140—92.2)

This invention relates to methods and apparatus for making wire feeding units that are used in the manufacture of semiconductor devices such as high frequency transistors.

This application is a continuation of copending application Serial No. 833,056, filed August 11, 1959, now abandoned.

The wires which make electrical contact to the electrodes of certain high frequency transistor devices are so tiny that they are nearly invisible to the naked eye. The wires employed in these transistors are gold filaments with a diameter of four ten-thousandths of an inch, which is considerably smaller than the diameter of human hair. A satisfactory method of connecting such very fine wire to the electrodes and lead terminals of the transistor is to bond the wires by thermo-compression techniques, but if the wire is contaminated in any way, it will not bond properly.

One convenient way of handling the wire is to encase it within a sheath of material such as silver and thereby build up the wire diameter to a point where it is strong enough to be handled and is readily visible. Cored wire of this type is called Wollaston wire. It has been proposed to feed the Wollaston wire to the bonding area through a tube to expose a required length, and then etch this exposed length to remove the outer sheath from the delicate inner filament. One or more transistor units are provided with contact wires by bonding the exposed length, and when this is used up an additional length is fed through the tube, etched, and bonded until it is exhausted. It has been found that this method of handling the wire is too difficult and time consuming to permit economical production on a quantity basis.

Accordingly, it is an object of the present invention to provide an improved method for preparing very fine wire so that it may be conveniently fed to an assembly point.

Another object of the invention is to provide a method for preparing Wollaston wire for use in the assembly of devices such as transistors, whereby all preliminary treatment of the wire including etching may be accomplished before the wire is fed to the assembly point with minimum danger of contamination or breakage of the wire.

A further object of the invention is to provide apparatus for preparing wire feeding units conveniently and quickly such that the units can be supplied to an assembly operation in sufficient quantity to permit carrying out the assembly operation on a mass production basis.

A feature of the invention is the provision of a method and apparatus for providing wire segments on elongated wire carriers or holders by winding a long length of wire about a mandrel which carries a number of the holders, fastening the wire to the holders where it crosses them, and cutting the wire on opposite sides of each holder such that the holder has a large number of wire segments extending therefrom like the teeth of a comb. The holder with the wire segments on it serves as a wire feeding unit which may be conveniently indexed to bring the wire segments into position for an assembly operation, such as bonding contact wires in transistor devices, and all wire segments on a given holder may be treated simultaneously for purposes of etching, annealing or other preliminary operations.

2

Another feature of the invention is the provision of apparatus and a method in which a continuous length of wire is wound helically around elongated holder members secured circumferentially about a drum, such that the wire crosses and contacts each holder at several places along its length, fastening the wire to the holders by applying a line or streak of adhesive to each holder, and cutting the wire into segments by rolling a cutting edge over the wire along a path between adjacent holders, thereby conveniently and quickly providing a large number of wire feeding units.

A further feature of the invention is the provision of a method and apparatus for preparing feeding units as described above, in which a drum having provisions for supporting several holder members is inserted into a winding jig with the holders in place, the wire is wound around the drum and holders, adhesive is applied to the holders, and the drum is then removed from the jig and another drum and holder assembly is inserted for winding while the adhesive on the previous assembly dries, whereby the jig may be employed continuously for purposes of maximizing the production rate.

The invention will be described with reference to the accompanying drawings in which.

Figures 1, 2, 3, 4:
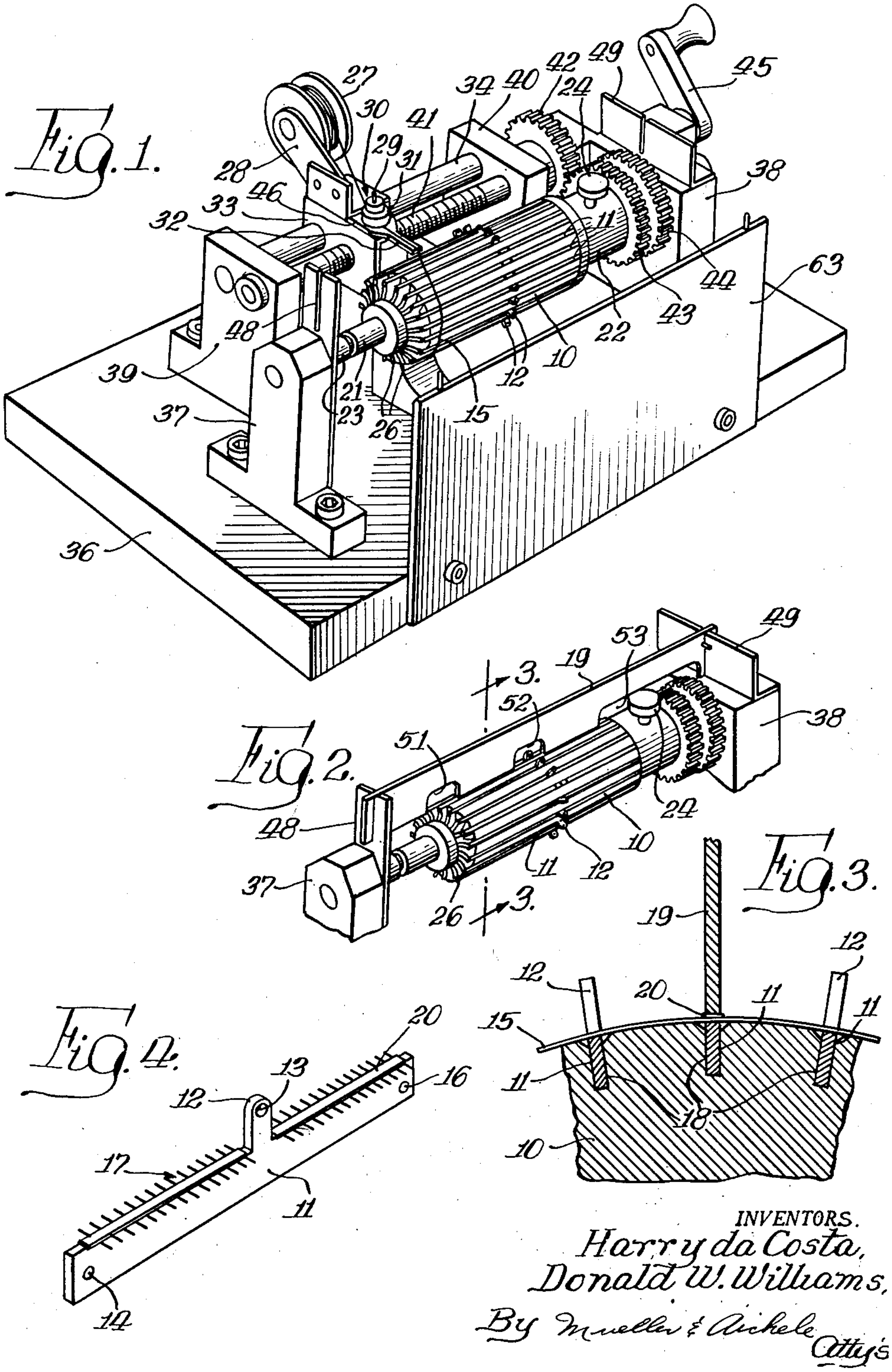
FIG. 1 is a perspective view of apparatus in accordance with the invention including a wire winding jig and a drum with a number of holder members supported circumferentially about the drum.
FIG. 2 is a view of a portion of the apparatus of FIG. 1 showing the relation of the drlum and holder assembly and a blade which applies adhesive to the holders for securing the wire in place.
FIG. 3 is a fragmentary sectional view taken along line 3—3 of FIG. 2 showing the applicator blade in contact with a holder.
FIG. 4 is a perspective view of a completed wire feeding unit prepared in the apparatus of FIG. 1.
Figures 5, 6, 6A, 7, 7A:
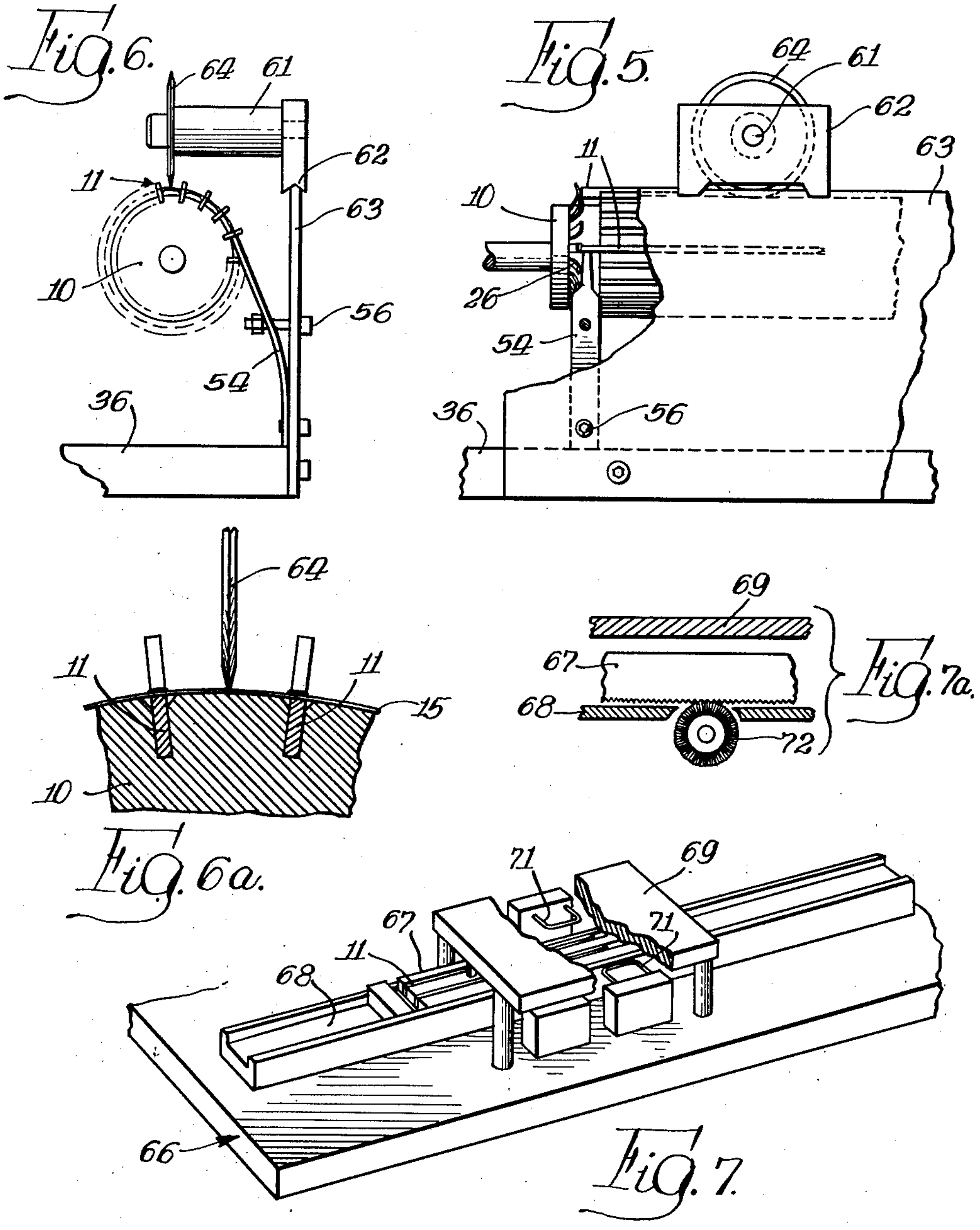
FIG. 5 is a view of the apparatus with certain portions cut away and showing particularly a cutting tool that is employed to cut the wire into segments.
Figure 8:
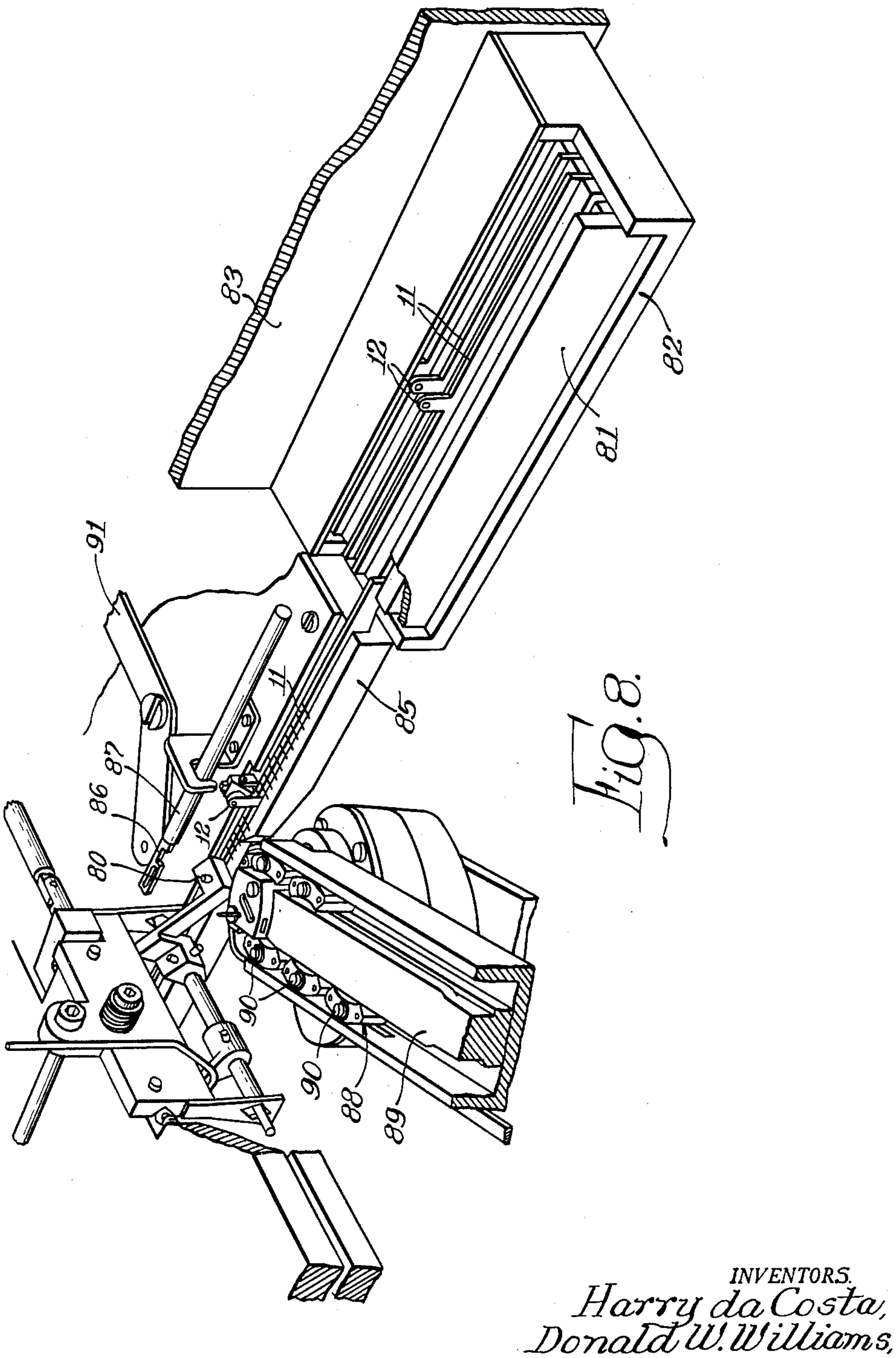

FIGS. 6 and 6*a* show the relation of the cutting tool and the drum as viewed from the end of the drum;

FIGS. 7 and 7*a* show a jig that is employed to anneal the wires on the wire feeding unit of FIG. 4; and FIG. 8 is a view of a portion of a bonding machine showing how the wire feeding units are employed to provide contact wires in the assembly of transistor devices.

The invention will be described as it is practiced in preparing wire feeding units for use in the manufacture of high frequency transistor devices. The wire that is employed has an outer sheath of silver with a diameter of about two thousandths of an inch and an inner core of gold with a diameter of about four ten-thousandths of an inch. The silver is etched away leaving the gold filament exposed and available for bonding to electrodes and lead terminals provided in the transistor device. The feeding units that are supplied to the bonding area consist of an elongated carrier or holder which has many short pieces or segments of wire secured to it and projecting from it much like the teeth of a comb. Because of this similarity in appearance, the wire feeding units are sometimes referred to as "combs."

These combs are prepared in a wire winding jig that receives a drum which carries twenty of the holder members around its circumference. After insertion into the jig, the drum serves as a mandrel. The winding jig includes a carriage which has a wire guide, a tensioning device, and a bracket that receives a reel from which the wire is unwound. The end of the wire from the reel is threaded through the tensioning device and the wire guide, and is secured to one end of the drum. The winding jig includes a gear mechanism which is coupled to the drum and also to the carriage, and when power is applied to the gears, such as by rotating a hand crank, the drum is rotated and the carriage is simultaneously moved parallel to the drum so that the wire is wound around the drum and over the holders in a helical path.

The wire is fastened to the holders by applying adhesive or sealing material over the length of each holder. The adhesive application is accomplished with the aid of a transfer blade which picks adhesive up from a platen on which a quantity of the adhesive has been smeared. The blade slips down onto the holder through slots in guide plates provided in the winding jig and transfers adhesive to the holder. The drum is then removed from the jig to allow the adhesive to dry, and additional drums may be wound while previous ones dry for purposes of maximizing the output rate in the winding operation.

After drying, the drum is reinserted into the winding jig, and a cutting wheel is drawn parallel to the drum axis between each two adjacent holders cutting the wire midway between the adjacent holders. This cutting operation is repeated as the drum is indexed through a complete revolution. At this point, each holder has about thirty wire segments on it arranged in the proper relation for bonding purposes.

The wire segments are etched to remove the silver sheath before supplying them to the bonding operation, and this is done by dipping the entire drum and holder assembly into an etching bath, followed by rinsing and drying. The combs are then removed from the drum and stored until needed for bonding. Then they are passed through an annealing jig as a final step preliminary to bonding.

The wire handling apparatus of the invention is illustrated in FIG. 1 and includes a cylindrical drum 10, which carries twenty elongated holders 11 in slots provided around the circumference of the drum. The appearance of the holders 11 and the way they fit on the drum is illustrated most clearly in FIGS. 3 and 4. FIG. 4 shows a complete wire feeding unit consisting of an elongated strip of stainless steel having a handle 12 and an aperture 13 in the handle. Additional apertures 14 and 16 are provided in each end of the strip to facilitate handling the unit. The complete unit has several pieces or segments of wire designated generally as 17 secured to the top edge of the holder, and these project on each side of the holder a distance of about $\frac{1}{16}$ of an inch. The stainless steel strip is about $\frac{1}{16}$ of an inch thick, $\frac{1}{8}$ of an inch broad and 4 inches long, and a strip of this size will conveniently carry about thirty of the wire segments 17.

FIG. 3 shows a fragmentary portion of the drum and holder assembly, and from this it may be seen how the holders 11 fit in the slots 18 provided in the drum. The upper edge of the holder 11 is flush with the outer surface of the drum 10, so that when the wire 15 is wound around the drum, it will contact both the holder and the drum surface in between holders. The drum surface may be bevelled slightly along the edges of the slots 18 as indicated in FIG. 3. The member 19 appearing in FIG. 3 is the adhesive applicator blade mentioned previously, and this will be described more fully when the adhesive application is discussed in detail.

The drum 10 may be readily inserted into and removed from the winding jig. To inert the drum into the winding jig as viewed in FIG. 1, the right hand end of the drum shaft 21 is slipped into the bushing 22, and the left-hand side of the drum shaft 21 is engaged with a guide or arbor 23. A knurled screw 24 is then tightened to hold the drum in place. An additional screw is provided on the left end of the drum, but this has been omitted in FIG. 1 to reveal the drum shaft 21. Then the holders 11 are loaded into the drum by inserting the right end of the holder into one of the slots, sliding the holder to the end of the slot, and lowering the other end of the holder down against one of the retainer springs 26 which are aligned with the left-hand end of each slot. The holder is then pressed down until it snaps into the slot, and the spring 26 holds it firmly in place.

The wire 15 is supplied to the drum from a reel or spool 27, which is rotatably mounted on the bracket 28. An end of the wire is threaded through an opening in a pin 29 which is part of a tensioning device designated generally as 30. The tensioning device 30 also includes weights 31 which fit down over the pin 29 and rest on the wire to keep it properly taut during the winding operation. From the tensioning device 30, the wire passes over a guide finger 32 which extends to a point very close to the drum 10. The finger 32 has a notch in its outer end which the wire slides through on its way to the drum 10. The end of the wire is fastened to the left end of the drum, and this may be accomplished simply by placing a piece of adhesive tape over the wire-end and onto the drum. The wire is now ready to be wound.

The reel 27, the tensioning device 30, and the wire guide 32 are all mounted on a carriage 33 which is movable parallel to the axis of the drum 10 along a shaft 34. The shaft 34 and the drum 10 are both supported on a frame which includes a base plate 36 and four uprights 37, 38, 39 and 40. A worm screw 41 is journalled in the uprights 39 and 40, and the screw is rotated by a gear 42 which is driven by the gear 43. The gear mechanism also includes a gear 44 driven by a pinion gear (not shown) which is rotated by means of a hand operated crank 45.

As the crank 45 is turned, the gear mechanism rotates the drum 10 and simultaneously rotataes the worm screw 41. The worm screw moves the carriage 33 from left to right as viewed in FIG. 1 so that the wire guide 32 moves along the length of the drum parallel to its axis. This causes the wire to be wound about the holder and drum assembly in a helical path such that the wire crosses each holder at several places along its length. When the wire guide 32 is a little short of midway of the length of the drum, the rotation is temporarily stopped. The wire is again secured to the drum by a piece of adhesive tape and is cut midway between the tape and the guide finger 32. The guide 32 and the reel supporting bracket 28 are secured to a plate 46 which is pivotally mounted on the carriage 33. Therefore, the guide and reel assembly may be tilted backwards as viewed in FIG. 1 to clear the handles 12 on the holders . The carriage is then moved a little to the right, the guide 32 is lowered back into place, and the end of the wire is fastened to the drum on the opposite side of the handles. The wire is then wound around the remainder of the drum in the manner described above, and is fastened to the drum and cut when it reaches the end of the drum.

The next step is to apply adhesive to the wire at the places where it contacts the holders, and this will be described with reference to FIGS. 2, 3 and 6. The applicator 19 is a flat blade of stainless steel that is about three hundredths of an inch thick, and it serves to transfer adhesive from a platen that has been smeared with a controlled thickness of the adhesive material onto the holder members 11. A satisfactory adhesive material is sold under the trade name "Glyptal" but any material having suitable drying and adhesive properties, and which will resist the etching acid that is later applied to the combs, may be substituted for the "Glyptal." The edge of blade 19 is lowered onto the adhesive on the platen, picks up the appropriate amount when lifted, and is then lowered into slots provided in the guide plates 48 and 49 supported respectively on the uprights 37 and 38. The blade 19 has cutout portions 51, 52 and 53 to provide clearance for the springs 26, the handles 12, and the screw 24. The lower edges of blade 19 are positioned over the wire directly above the holder 11 as indicated in FIG. 3, and the adhesive is thus laid down on the holder in a thin streak or filament 20 extending along nearly the entire length of the holder, except where the handle 12 is located (see FIG. 4 also). The blade 19 is then removed, and the drum is indexed one step to bring the next successive holder into position for gluing.

The indexing is provided by a spring brake 54 shown in FIGS. 5 and 6. The spring 54 cooperates with the left-hand end of the holders as viewed in FIG. 5 to provide a ratchet mechanism for indexing the drum. The end of the drum is reduced in diameter such that the holders 11 are exposed and serve as ratchet "teeth" as may be seen in FIG. 5, where some of the holders have been omitted in order to show this. During the wire winding operation, the spring 54 is disengaged from the drum and is held away from it by a nut and bolt 56, shown in the released position in FIG. 6.

After the adhesive is applied to all of the holders 11 on the drum 10, the drum is removed from the jig by releasing the screw 24 (FIG. 1) and lifting the drum out. The drum is placed in a storage rack to dry at room temperature for a minimum of two hours. During this drying time, additional drums may be inserted into the jig and prepared in the manner previously described.

After a drum has dried it is loaded back into the winding machine in the manner described above, and the brake 54 is set against the drum as indicated in FIGS. 5 and 6. A cutting tool 61 is then mounted on the machine in the position illustrated in FIGS. 5, 6 and 6*a*. The cutting tool 61 has a recessed base 62 which fits on the upper edge of a plate 63. The tool 61 has a cutting wheel of highly sharpened carbon steel which engages the drum midway between two adjacent holders as illustrated in FIG. 6*a*. The base 62 slides along the track provided by the upper edge of the plate 63, and the wheel 64 rolls along the drum and over the wire 15, cutting the wire each time it crosses the path of the wheel 64. The drum is indexed step-by-step through a complete revolution, and the cutting process is repeated at each index position until the wire has been cut between each two adjacent holders. After the cutting operation, each holder has a plurality of wire segments extending from it as illustrated in FIG. 4. The cutting wheel 64 is about 2 inches in diameter and is about four times sharper than a razor blade, and from this it is apparent that it will cut the wire very easily without burring or otherwise distorting the wire ends. The cutting tool 61 and the drum 10 are then both removed from the jig, and additional drums may be cut at this point if desired.

The next step is to remove the silver sheath from the wire segments to expose the inner gold filaments. An etching bath is prepared by mixing a solution of fifty percent distilled water and fifty percent nitric acid in a container which is sufficiently deep to permit immersing the entire drum 10 in the etching bath. The drum is lowered and raised in and out of this bath until it has been etched for a total time of about ten minutes, and is then washed in cold distilled water, followed by a rinse in distilled water heated to 50–60° C. After drying, the holders 11 are removed from the drum, and this may be done conveniently with the drum supported in the winding jig. Tweezers are hooked through the aperture 14 in the end of the holder 11 (FIG. 4), and the holder is lifted out of the slot in the drum and is placed in a storage box. After all holders have been removed, they are inspected under a microscope for contamination, flat ends, improper length, or other defects. The holders are left in the storage box until they are needed for the bonding operation.

Just prior to bonding, the wires are annealed by passing the holders 11 through an annealing jig 66 which is illustrated in FIGS. 7 and 7*a*. Two of the holders are placed in a carrier block 67, which fits into a track 68 that extends under a plate 69. A portion of the plate 69 is broken away in FIG. 7 to show the heating filaments 71. The bottom of the carrier 67 is provided with teeth which mesh with a gear 72 in the center of the track 68 as shown schematically in FIG. 7*a*, and this gear draws the carrier 67 past the heating filaments 71. When the holder has passed through the annealing jig once, only one-half of the wires have been annealed. Therefore, the holders are interchanged from one side of the carrier 67 to the other, and are then passed through the annealing jig a second time.

The wire feeding units are then ready for use in a bonding machine, part of which is shown in FIG. 8. Several of the holders 11 are provided in a storage tray 81 that slides on a support 82 which extends from the outside to the inside of an enclosure represented by the fragmentary panel portion 83. The holders are fed from the tray 81 into a slot in a positioning plate 85 by engaging a cutout portion 86 of the rod 87 with the handle 12 on the holder, and pushing the rod to the left and rearwardly as viewed in FIG. 8. The bonding is accomplished by a bonding tool 80, and this tool is brought down onto the electrodes and terminal leads of header assemblies 90 which are fed to the bonding area by a chain 88 that moves in a track unit 89. The holder 11 is positioned on the plate 85 as indicated in FIG. 8 and is indexed by operation of a lever 91 to bring the wire segments successively to the bonding area. The wire segment nearest the bonding area is accurately positioned right on top of the transistor's electrode or terminal lead, as the case may be, by operating a micromanipulator control to move the plate 85. When all of the wire segments on a given holder are used up, the holder is returned to the storage tray 81 by manipulation of the rod 87, and a fresh holder is then brought into alignment with the slot in plate 85 and is slid into place for indexing.

Thus, the wire feeding units provided in accordance with the invention supply contact wires for bonding in a fast and convenient manner. The method of preparing the wire feeding units is straightforward and can be carried out on a mass production basis. The apparatus for winding, gluing and cutting the wire is economical and can be handled by a relatively unskilled operator who can achieve a high production rate with relatively high yields.

We claim:

1. A method of applying wires to a holder and supplying the same to an assembly area at which portions of individual ones of such wires are mounted in electronic units and removed from the holder, said method including the steps of mounting a plurality of elongated rigid holders in longitudinal recesses on a cylindrical mandrel so that a wire-receiving surface of each holder extends axially of the mandrel and is substantially flush with the circumference of the mandrel, winding a length of wire about the mandrel in a helical path such that the wire contacts each holder at several places spaced along its length and also contacts circumferential surfaces of the mandrel between the holders, securing the wire to the holders at said places of contact therewith, rolling a sharp, curved cutting edge axially of the mandrel on and along the circumferential surfaces of the mandrel between each two adjacent holders so that the cutting edge rolls over the wire and cuts through the same without bending the wire due to the anvil-like backing provided by said mandrel, thereby providing each of said holders with a plurality of wires extending transversely therefrom in spaced parallel relation with each other and having free end portions available to be removed from said holder while assembling the same into electronic units, removing the holders from the mandrel, subsequently feeding individual ones of said holders to an assembly area and positioning such holder at said area to make wires successively available for assembly in electronic units, individually mounting said end portions of said wires in electronic units at said assembly area and removing said end portions from said holder in accomplishing said mounting.

2. A method of processing a continuous length of microminiature wire and supplying pieces thereof to an assembly area at which portions of individual ones of such wires are mounted in electronic units, said method including the steps of mounting a plurality of elongated rigid holders in longitudinal recesses on a cylindrical mandrel with the holders extending axially of the mandrel and spaced from each other about the circumference of the mandrel, and with surfaces of said holder adapted to receive wire substantially flush with surfaces of the mandrel between said holders, winding a length of wire about the mandrel in a helical path such that the wire contacts each holder at several places spaced along its length and also contacts the circumferential surfaces of the mandrel between the holders, applying fluid adhesive material to each of said holders and to the wire thereon so that the adhesive material maintains the wire on the holders when such material has solidified, rolling a sharp, curved, cutting edge axially of said mandrel on the circumferential surface thereof on both sides of each holder so that said cutting edge rolls on and cuts cleanly through said wire on both sides of each holder without bending the wire, thereby providing each of said holders with a plurality of wires extending transversely therefrom in spaced parallel relation with each other and having free end portions available to be removed from said holders for assembly in electronic units, removing said holders from said mandrel, subsequently feeding individual ones of said holders to an assembly area, positioning said holder so as to supply the individual wires thereon successively to electronic units for mounting therein, individually bonding said end portions of said wires to connector parts in electronic units at said assembly area, and removing said bonded end portions from said holder in accomplishing said mounting.

References Cited in the file of this patent

UNITED STATES PATENTS

| | | |
|---|---|---|
| 1,169,698 | Von Vass | Jan. 25, 1916 |
| 2,136,649 | Wadsten | Nov. 15, 1938 |
| 2,633,876 | Gasser et al. | Apr. 7, 1953 |
| 2,824,251 | Patterson | Feb. 18, 1958 |
| 2,909,200 | Miller et al. | Oct. 20, 1959 |
| 2,936,664 | Myers | May 17, 1960 |
| 3,003,525 | Fuller | Oct. 10, 1961 |